United States Patent
Hedberg

(10) Patent No.: US 6,215,339 B1
(45) Date of Patent: Apr. 10, 2001

(54) INPUT BUFFER CIRCUIT

(75) Inventor: Mats Hedberg, Haninge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/367,637

(22) PCT Filed: Feb. 19, 1998

(86) PCT No.: PCT/EP98/00954

§ 371 Date: Aug. 18, 1999

§ 102(e) Date: Aug. 18, 1999

(87) PCT Pub. No.: WO98/37632

PCT Pub. Date: Aug. 27, 1998

(30) Foreign Application Priority Data

Feb. 21, 1997 (DE) .............................. 197 06 985

(51) Int. Cl.[7] .................. H03B 1/00; H03K 3/00
(52) U.S. Cl. ................ 327/108; 327/65; 327/563; 327/52; 330/253; 330/51
(58) Field of Search ............... 327/52–55, 65, 327/67, 68, 87, 89, 561–563, 108–110; 330/136, 51, 252, 253

(56) References Cited

U.S. PATENT DOCUMENTS

| | | | |
|---|---|---|---|
| 3,956,643 | | 5/1976 | Hite .................................... 327/357 |
| 4,617,473 | * | 10/1986 | Bingham ............................ 327/63 |
| 5,003,578 | | 3/1991 | Lin ..................................... 379/90 |
| 5,412,688 | | 5/1995 | Marbot ............................... 375/220 |
| 5,510,751 | * | 4/1996 | Nauta ................................. 330/260 |
| 5,606,281 | * | 2/1997 | Gloaguen ........................... 330/51 |
| 5,608,352 | * | 3/1997 | Itakura ............................... 330/253 |
| 5,703,518 | * | 12/1997 | Yamamoto ......................... 327/354 |
| 5,905,408 | * | 5/1999 | Huijser .............................. 330/51 |
| 5,991,182 | * | 11/1999 | Novac et al. ..................... 363/126 |

FOREIGN PATENT DOCUMENTS

| | | |
|---|---|---|
| 4241215 | 6/1994 | (DE) . |
| 0504060 | 9/1992 | (EP) . |
| 0647898 | 4/1995 | (EP) . |

OTHER PUBLICATIONS

Patent Abstract of Japan, Publication No. 03278741, Dec. 10, 1991.

Siemens "1 hr Programm," Bestell Nr. A 19100–5 52–M 153, Aug. 26, 1994.

* cited by examiner

Primary Examiner—Terry D. Cunningham
Assistant Examiner—Long Nguyen
(74) Attorney, Agent, or Firm—Burns, Doane, Swecker & Mathis, L.L.P.

(57) ABSTRACT

An input buffer circuit for receiving digital data signals from a transmission line includes a monitor section for monitoring data signals at the input of the buffer circuit. A power control section receives a control signal from the monitor section depending on whether the data is detected at the input of the input buffer circuit. The power control section can switch the input buffer into a low power standby mode or into an operating mode depending on whether a data signal transmitted via the transmission line is available at the input of the monitor section.

9 Claims, 2 Drawing Sheets

INPUT BUFFER CIRCUIT

BACKGROUND OF THE INVENTION

The present invention relates to an input buffer circuit for receiving digital data signals from a transmission line according to the preamble of claim 1. An input buffer circuit of this kind is known from EP-A-0 504 060.

Digital circuits and technology are the key for systems with an ever increasing performance and functionality. This goes together with a continuously increasing scale of integration and an increase in the complexity of digital systems. Different sections of such systems communicate via impedance matched transmission lines which constitute an inexpensive and convenient means for carrying data rates in the order of several hundred Mbit/s over short and medium distances within a digital system.

In complex systems, power consumption is a major point of concern. The more complex and compact the system, the more important it is that each system component uses as little operating power as possible. Differential signalling with low signalling voltages is well suited to meet the requirement of low power transmission and, due to the symmetric nature, also the requirement of noise immunity.

In order to transmit data via a symmetrical transmission line, a line driver circuit is required at the transmitting side of the transmission line in order to provide low impedance data signals. The amplitude of these data signals is low, in order to keep the power transmitted over the transmission line with a given characteristic impedance, reasonably small. At the receiver side of the transmission line an input buffer circuit is provided, for receiving the digital data signals and for outputting a corresponding digital signal to subsequent sections.

In large systems, e.g. if standardized interfaces between system subsections are provided, the number of available channels is sometimes higher than the number of actually needed channels. Regardless, whether an available channel is used or not, for each available channel an input buffer circuit is provided which will consume operating power. Of course, each input buffer could be individually connected to the power supply or disconnected from the power supply. This, however, would require special elements like jumpers or switches for allowing individual settings. Additional space would be required and the overall system reliability would be lower, and additional costs would arise in the process of manufacture.

It is, therefore, an object of the present invention to provide an input buffer circuit for receiving digital data signals from a transmission line, wherein the circuit is very power efficient even if it is not currently being used in a specific system configuration.

SUMMARY OF THE INVENTION

According to the present invention, this object is solved as defined in claim 1.

Advantageous embodiments of the present invention are defined in the dependent claims.

The input buffer circuit according to the present invention monitors, whether data signals are present at its inputs. If data are detected, the input buffer circuit is switched into an operating state in order to receive the transmitted data and output the same. If no data are detected at the input of the buffer circuit, at least the portions not required for monitoring the presence of absence of input data and significantly contributing to the overall power consumption of the input buffer circuit, are switched into a standby mode with reduced power consumption or no power consumption at all. Preferably, means are provided for applying a predetermined potential to the output terminal of the input buffer circuit when in the standby state, in order to avoid unpredictable or undefined states in the subsequent digital circuitry.

Monitoring of the presence or absence of data at the input of the buffer circuit takes place by means of monitoring the signal amplitude across the inputs of the amplifier section. If an absolute voltage difference across the input terminals is above a predetermined threshold, this is an indication for data being present at the inputs. If, on the other hand, this absolute voltage difference is below the predetermined threshold, it indicates that no data are present at the inputs and that the input buffer circuit may switch into the standby state. The monitor section comprises an analogue multiplier circuit having first and second differential inputs and an output, as defined in claim 1.

According to a preferred embodiment of the invention the operating or standby mode of the input buffer circuit is controlled by the output buffer connected to the transmitting side of the transmission line. If temporarily there are no data for the output buffer to be transmitted, the output buffer sets its outputs to equal potential, e.g. by means of switching off the power supply to the output buffer or by means of switching the outputs of the output buffer into a high impedance mode or disconnecting the outputs from the transmission line or by means of applying equal potential to the output terminals of the output buffer. At the receiving end of the transmission line, the input buffer will then switch into the low power standby mode, without the need to provide a separate signalling channel for power control.

BRIEF DESCRIPTION OF THE DRAWINGS

In the following, preferred embodiments of the present invention will be explained in detail with reference to the accompanying drawings. In these drawings.

DETAILED DESCRIPTION

Figure 1:
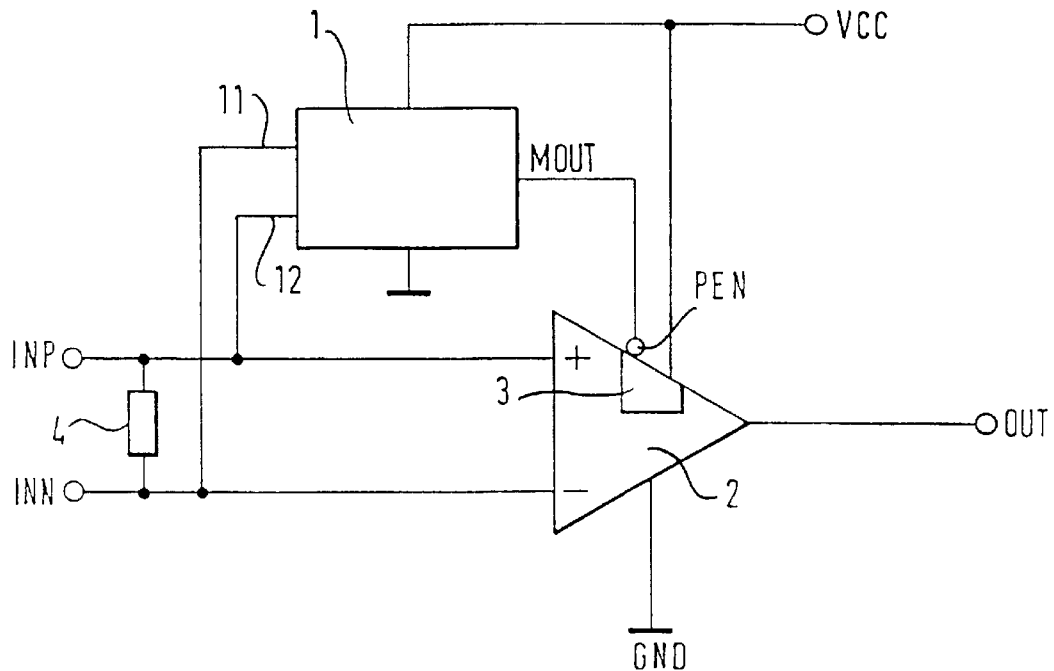
FIG. 1 shows a block diagram of an embodiment of an input buffer circuit according to the present invention.

FIG. 1 shows a block diagram of an embodiment of an input buffer circuit according to the present invention.

In this Figure, reference numeral 1 denotes a monitor section for monitoring the availability of data to be received by the input buffer circuit. Monitor section 1 comprises input terminals 11 and 12 and an output terminal MOUT for outputting the detection result.

Reference numeral 2 denotes an input amplifier section having a noninverting input terminal INP and an inverting input terminal INN for connection to a data transmission line. Input amplifier section 2 receives the data signals transmitted via the transmission line and outputs a digital signal in correspondence with the received digital data signal at its output terminal OUT. Reference numeral 4 denotes an optional termination impedance providing for proper termination of the characteristic impedance of the transmission line at the input terminals INP and INN.

Reference numeral 3 denotes a power control section provided in the input amplifier section 2. The power control section 3 receives the output signal MOUT from the monitor section 1 at a power control terminal PEN. In accordance with this signal, power control section 3 causes the amplifier section 2 to be either in an operating state when data are available at the input terminals INP, INN of the input amplifier 2 or causes the input amplifier 2, to be in a low power standby state when no input data are available at INP, INN.

VCC and GND denote the power supply terminals of the input buffer circuit. In this embodiment the monitor section 1 and the power control section 3 are immediately connected to VCC and GND. The input amplifier section 2 receives its operating power through the power control section 3. Of course, a variety of other constellations is feasible. For instance, the control signal MOUT output by the monitor section 1 may directly control constituent elements of the amplifier section 2, e.g. switch on or off the current sources included in some or all of the signal amplification stages of the amplifier section 2.

Depending on the specific design, a preamplifier section (not shown) may be provided e.g. for increasing the common mode input range of the input buffer. Then, the inputs of the preamplifier are connected to the transmission line and the outputs of the preamplifier provide the signals INP, INN of FIG. 1. In this case, the line termination impedance 4, if provided, would not be provided across INP, INN but across the inputs of the preamplifier section.

Figure 2:
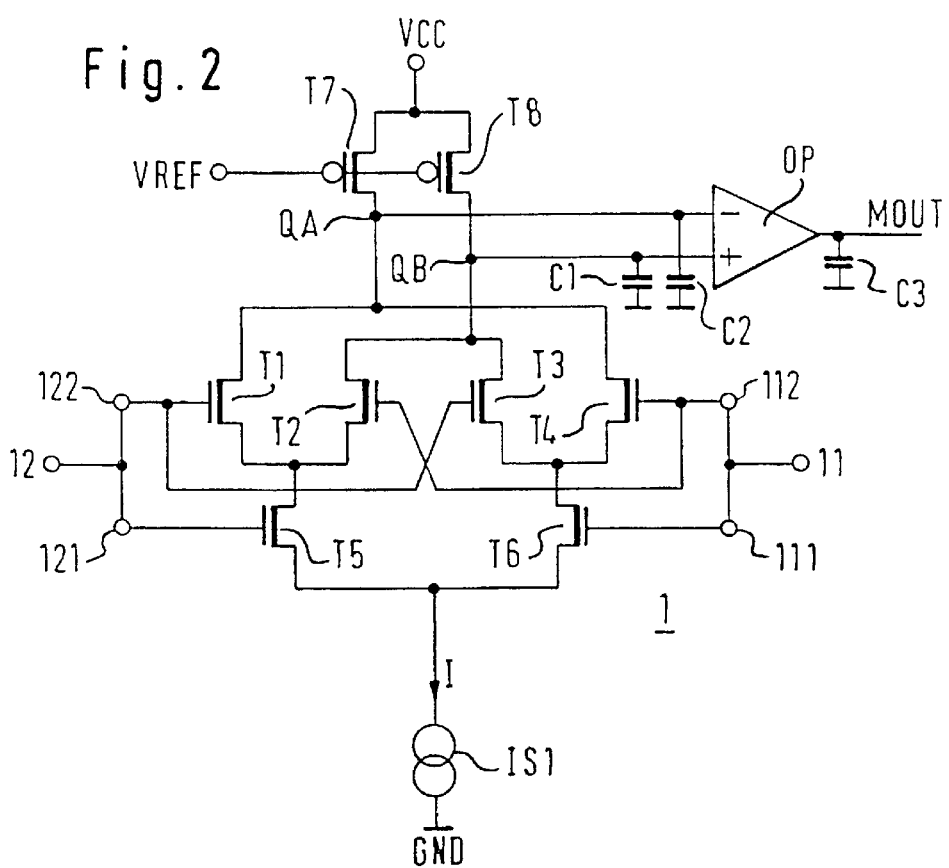
FIG. 2 shows a schematic diagram of an embodiment of the monitor section of FIG. 1.

FIG. 2 shows a schematic diagram of an embodiment of the monitor section of FIG. 1.

In this Figure, reference numerals 11 and 12 denote the input terminals of the monitor section 1. This section comprises transistors T1 to T6 which are connected, to function as as an analogue multiplier circuit. Specifically, the sources of transistors T5 and T6 are connected together and to a current Source IS1. This current source can e.g. be of cascode type and provides for the sum of the source currents of T5 and T6 being equal to I. The gates of transistors T5 and T6 constitute a first differential input with input terminals 121 and 111.

The sources of transistors T1 and T2 are connected together and to the drain of transistor T5. The sources of transistors T3 and T4 are connected together and to the drain of transistor T6. The drains of transistors T1 and T4 are connected together and via a first load circuit to VCC. Similarly, the drains of transistors T2 and T3 are connected together and via a second load circuit to VCC. In this embodiment the first and the second load circuit, respectively, is constituted by a transistor T7 and T8, respectively, with a conductivity type opposite to the conductivity type of transistors T1 to T6. The gates of transistors T7 and T8 receive a reference voltage VREF which can be generated in a number of different ways, each of which is well known in the art.

The gates of transistors T1 and T3 are connected together and constitute a first input terminal 122 of a second differential input 122, 112 of the analogue multiplier circuit. The gates of transistors T2 and T4 are connected together and constitute the second input 112 of the second differential input 122, 112.

In this embodiment, the first and the second differential input of the analogue multiplier circuit are connected such that the analogue multiplier circuit outputs a signal that depends on the absolute voltage difference across the inputs 11, 12 of the monitor section 1. For this purpose, one input 111 of the first differential input 111, 121 is connected with one input 112 of the second differential input 112, 122, thus constituting the first input 11 of the monitor section 1, while the other input 121 of the first differential input is connected with the other input 122 of the second differential input 112, 122, thus constituting the second input terminal 12 of the monitor section 1.

Reference numerals QA and QB denote output nodes of the analogue multiplier circuit. QA is connected to the drains of transistors T7, T1 and T4 whereas QB is connected to the drains of transistors T8, T2 and T3. These out put nodes are connected with the inverting input and the noninverting input, respectively, of a comparator circuit OP. This comparator circuit can be implemented in a large number of different ways, each of which is well known in the art.

C1 and C2 denote optional capacitances for smoothing the signals at the noninverting input and the inverting input, respectively, of the comparator circuit OP. These capacitances can e.g. be implemented by means of exploiting the gate capacitance of MOS transistors, such that drain and source of a transistor element connected together, constitute one electrode of the capacitor, whereas the gate constitutes the other capacitor electrode. Of course, other implementations of these capacitances are feasible.

The output of the comparator circuit OP provides the control signal MOUT of the monitor section 1. C3 denotes an optional capacitor for absorbing transient voltage spikes resulting from the operation of this circuit.

In operation, the current I provided by current source IS1 is split up among the first triple transistor group T1, T2, T5 connected in a Y-configuration, and the second triple transistor group T3, T4, T6 connected in a Y-configuration. The split-up ratio depends on the voltage difference across the inputs 111 and 121. Each of the upper transistor pairs T1, T2 and T3, T4, respectively, splits up the current through the lower transistors T5 and T6, respectively, of the respective triple transistor group depending on the voltage difference across the second differential input 112, 122. If all transistors T1 to T6 of the two triple transistor groups have similar electrical characteristics and if the voltage across the second differential input 112, 122 is zero, the current through both load circuits T7 and T8 will be symmetrical. This results in the output voltage difference across nodes QA and QB being zero if T7 and T8 are symmetrical, regardless a voltage difference across the first differential input 111, 121. Similarly, the currents through T7 and T8 will be symmetrical if the voltage across the first differential input 111, 121 is zero, regardless a voltage difference across the second differential input 112, 122. Due to respective inputs of the first and the second differential inputs of the analogue multiplier being connected together, the currents through the load elements T7 and T8 will be symmetrical if the voltage across the inputs 11, 12 of the monitor section 1 is zero, i.e. if no data are available. On the other hand, as soon as a voltage difference occurs across the inputs 11, 12 of the monitor section 1, the current through load element T7 will be larger than the current through load element T8, regardless the polarity of the voltage difference across the inputs 11 and 12. This difference in the currents through elements T7 and T8 results in a voltage difference across the nodes QA, QB. If this voltage difference exceeds a given threshold, the comparator circuit OP switches its output to indicate that data are present across the input terminals 11, 12.

Setting of the predetermined threshold can be performed in a number of different ways. One possibility is, to provide the comparator circuit with a predetermined input offset voltage such that switching of the output MOUT takes place if the voltage difference across QA, QB reaches a predetermined value. In this case, the circuit including the transistors T1 to T8 can be designed symmetrical with regard to the electrical characteristics of the components involved.

In the alternative, the comparator circuit OP is designed such that the output MOUT of the comparator switches if the voltage difference across its inputs crosses zero. Then, a predetermined threshold for switching the output signal at MOUT can be provided by means of designing the first triple transistor group T1, T2, T5 and the second triple transistor group T3, T4, T6 such that the electrical characteristics of the transistors within at least one triple group are nonsymmetric, or such that the electrical characteristics of transistors T7, T8 are nonsymmetric or both. Specifically, the predetermined threshold can be adjusted by means of appropriately setting the ratio of the channel width or length of transistors T1 and T2 or by means of setting the ratio of the channel width or length of transistors T3 and T4 or both. If at least one of the transistors T1, T4 has a smaller channel width than at least one of transistors T2, T3, the current through load element T7 will be smaller than the current through load element T8, given the voltage difference between terminals 11 and 12 is zero. In this way it can be achieved that the potential difference across the nodes QA and QB crosses zero only if the absolute voltage difference across input terminals 11 and 12 of the monitor section 1 reaches a predetermined threshold value.

In addition or in the alternative to providing the channel geometries of transistors T1, T4 different from the channel geometries of T2, T3, the channel geometries of transistors T7, T8 can be made different from each other in order to achieve that the potential difference across the nodes QA and QB crosses zero when the absolute voltage difference between input terminals 11 and 12 of the monitor section 1 reaches a predetermined threshold value. If the channel width of T7 is provided larger than the channel width of T8, the potential of QA will be higher than the potential of QB, if the voltage difference across the inputs 11, 12 is zero, even if both triple transistor groups comprising the transistors T1 to T6 are symmetric.

A further possibility for providing said threshold is to connect a shunt from QB to GND or to the source of T6 or from QA to VCC. Such a shunt may be implemented by means of a resistor or transistor (not shown).

Capacitors C1, C2, C3 are optional and serve to suppress transient potential changes at the nodes QA, QB due to polarity changes across the input terminals 11, 12. During data transmission, the signalling voltage difference across the input terminals of amplifier section 2 will change its sign in accordance with the transmitted stream of bits. Changing sign involves zero crossings of the voltage difference across terminals 11 and 12 of the monitor circuit 1, this in turn resulting in transients in the potential difference between QA and QB. Since these transients are short, they can be suppressed by means of designing the comparator OP to have a sufficiently slow response time. In this specific embodiment, this is achieved by means of providing the capacitors C1 to C3. In this way, the output signal MOUT of the comparator OP will remain stable also during the zero crossings of the data signal across the input terminals 11, 12 of the monitor section 1.

Figure 3:
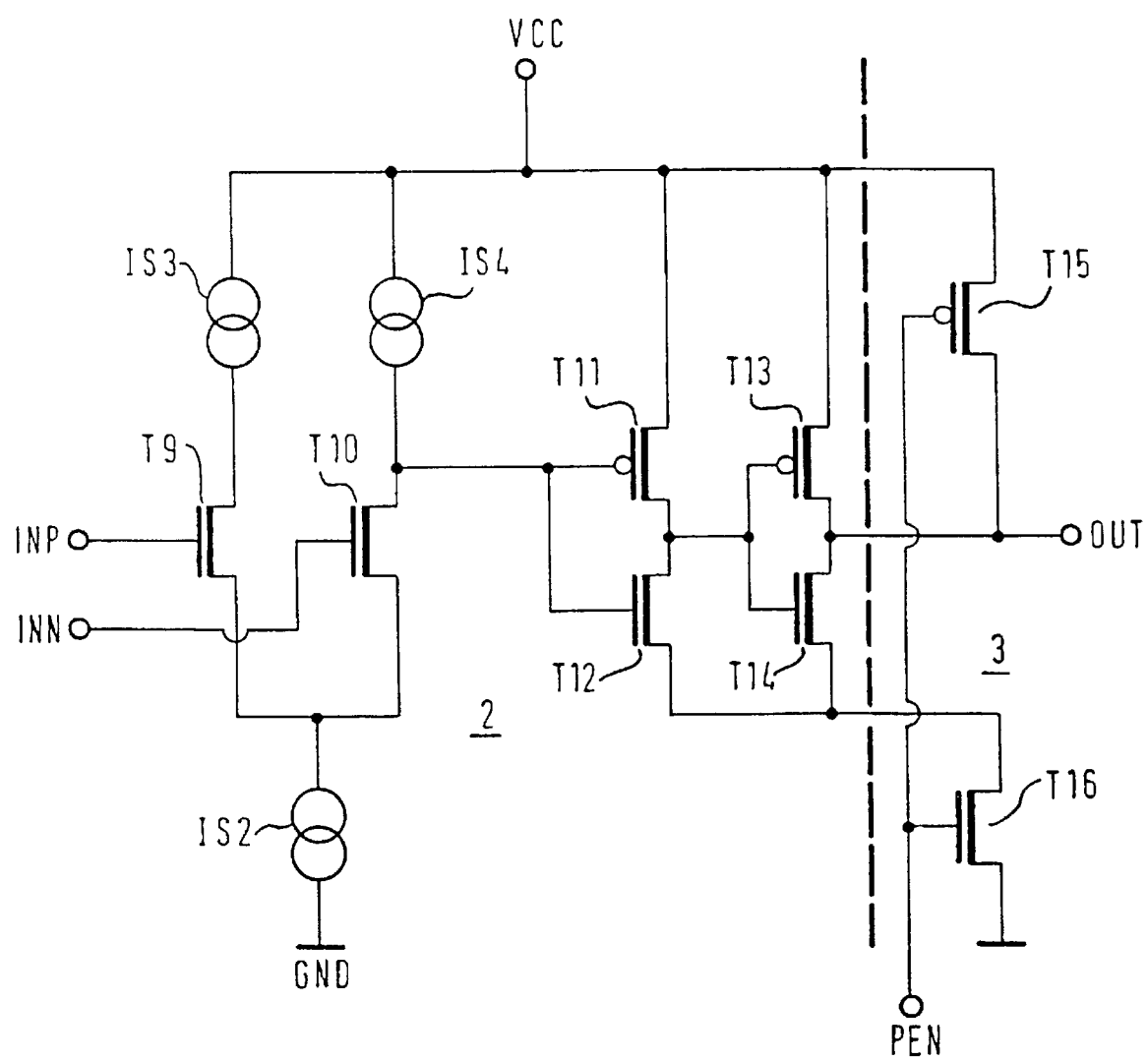
FIG. 3 shows a schematic diagram of an embodiment of the amplifier section and the power control section of the embodiment of FIG. 1.

FIG. 3 shows a schematic diagram of an embodiment of the amplifier section and the power control section of the embodiment of FIG. 1.

In this Figure, T9 and T10 denote transistors constituting a differential input stage of the amplifier section 2. The sources of transistors T9 and T10 are connected together and to a constant current source IS2. The other terminal of the constant current IS2 is connected to ground GND. Each of the transistors T9 and T10 has its drain connected with a current source IS3 and IS4, respectively. The terminals of IS3 and IS4 not connected to transistors T9, T10, are connected to the power supply potential VCC. The current sources IS3 and IS4 can be implemented by means of a current mirror. In this case, a first MOS transistor (not shown) with a conducting type opposite to transistor T9, is provided in the drain path of transistor T9, and a second transistor (not shown) with a conducting type opposite to transistor T10, is provided in the drain path of transistor T10. The gates of these first and second transistors (not shown) are connected together and with the drain of T9.

Transistors T11, T12 constitute an inverting driver stage. T11 has a conductivity type opposite to T12. The gates of transistors T11 and T12 are both connected with the drain of transistor T10. The source of transistor T11 is connected to VCC and the drain of transistor T11 is connected to the drain of transistor T12.

Transistors T13 and T14 constitute the output stage of the amplifier section 2. T13 has a conductivity type opposite to T14. The gates of these transistors T13, T14 are both connected to a node between the drain of transistor T11 and the drain of transistor T12. The source of transistor T13 is connected to VCC while the drain of transistor T13 is connected to the drain of transistor T14. The drain of transistor T13 and the drain of transistor T14 constitute the output node of the amplifier section 2 which is connected with the output terminal OUT.

Transistors T15 and T16 constitute the power control section 3 of the amplifier section 2. The drain of transistor T16 is connected to the source of transistor T12 and to the source of transistor T14. The source of transistor T16 is connected to ground. Transistor T15 has a conductivity type opposite to the conductivity type of transistor T16. The drain of transistor T15 is connected to the output terminal OUT whereas the source of transistor T15 is connected to VCC. The gate of transistor T15 and the gate of transistor T16 are connected together and to the power control input terminal PEN of the power control section 3. As shown in FIG. 1, this power control input terminal PEN is connected with the power control output terminal MOUT of the monitor section 1.

In operation, the input stage constituted by transistors T9 and T10, together with the constant current sources IS2, IS3 and IS4, provides a differential input amplifier. Due to the provision of the constant current sources IS3, IS4 in the drain paths of the transistors T9, T10, this input stage has a high voltage amplification and provides a digital signal at the drain of transistor T10 depending on whether the input voltage difference across the input terminals INP, INN is positive or negative. The drain voltage signal of transistor T10 is amplified and inverted by the driver stage consisting of transistors T11, T12, provided that the power control input signal PEN is at high potential and renders transistor T16 conducting. Under this condition, the drain of transistor T12 and the drain of transistor T11 provide a low impedance signal suitable for driving the gates of transistors T13 and T14. Then a high speed digital signal with a sufficiently high slew rate is provided at the drain of T14 and at the drain of T13. Due to PEN being at high potential, transistor T15 is switched off.

If the monitor section now detects, that no data are available at its input, the output MOUT of the monitor section 1, and accordingly the power control input PEN of power control section 3 changes to a low potential. This results in transistor T16 switching off and transistor T15 switching on. As a consequence, neither the driving stage consisting of transistors T11, T12 nor the output stage comprising the transistors T13, T14, receives operating power but enters a low power standby state. At the same time, transistor T15 pulls the output terminal OUT up to high potential, in order to keep the potential of the output terminal OUT well defined.

The stages of the amplifier section 2 and current sources IS2, IS3 and IS4 can be implemented in different ways each of which is well known in the art. Depending on the particular kind of current source, the power control signal PEN may enable or disable any or all of the current sources IS2 to IS4 of the amplifier section 2. If it is desired that in the low power standby state, the output terminal OUT takes low potential rather than high potential, transistor T15 may be replaced by a transistor (not shown) of the same conductivity type as transistor T12. The source of this transistor (not shown) would then be connected to ground and its drain would then be connected to the output terminal OUT. Transistor T16 would then be provided with opposite conductivity type and in the source paths of transistors T11, T13. The sources of transistors T12, T14 would then be connected to ground GND, and the power control signal PEN would be inverted.

The above embodiments refer to using MOS transistors. A design with bipolar transistors or a mixed design with both bipolar and MOS transistors is equally feasible.

What is claimed is:

1. An input buffer circuit for receiving digital data signals from a transmission line, comprising
   an amplifier section (2) having a non-inverting input (INP) and an inverting input (INN) connected for receiving data signals transmitted over said transmission line, and an output (OUT) for outputting digital data corresponding to the received digital data signals;
   a monitor section (1) having a first input connected to the non-inverting input (INP) of said amplifier section, a second input connected to said inverting input (INN) of said amplifier section (2), and a monitor output (MOUT); and
   a power control section (3) connected to receive a control signal from said monitor output (MOUT) of said monitor section (1);
   said monitor section being adapted to output said control signal (MOUT) depending on whether a data signal transmitted via said transmission line is available at the inputs (INP, INN) of said monitor section (1);
   said power control section (3) being adapted to switch said amplifier section (2) into a low power stand-by state if no data are detected by said monitor section, and to switch said amplifier section into an operating state if data are detected by said monitor section (1);
   wherein
   said monitor section (1) is adapted to output said control signal (MOUT) indicating that data are present if an absolute difference between signals present at said first and second monitor section inputs is larger than a predetermined threshold, and to output said control signal (MOUT) indicating that no data are present, if said difference is smaller than said predetermined threshold;
   characterized in that
   said monitor section (1) comprises an analogue multiplier circuit (T1 to T6) having a first differential input (112, 122), a second differential input (111,121) and an output (QA, QB);
   a first terminal (122) of said first differential input being connected with a first terminal (121) of said second differential input, and a second terminal (112) of said first differential input being connected with a second terminal (111) of said second differential input;
   said first terminals (121, 122) of said first and second differential input constituting said first input (12) of said monitor section (1), and said second terminals (111, 112) of said first and second differential input (11) constituting said second input of said monitor section (1).

2. An input buffer circuit according to claim 1, wherein said analogue multiplier circuit comprises
   a first triple group of transistors (T1, T2, T5) and a second triple group of transistors (T3, T4, T6);
   the transistor of each triplet of transistors being respectively connected in Y fashion such that the source terminals of first and second transistors (T1, T2; T3, T4) of the upper branches in each triplet are connected with the drain terminal of the transistor (T5; T6) in the lower branch;
   the drain terminals of the first upper branch transistor (T1) of the first triplet and the first upper branch transistor (T4) of said second triplet being connected together;
   the drain terminals of the second upper branch transistor (T2) of the first triplet and the second upper branch transistor (T3) of said second triplet being connected together;
   a first and a second load circuit (T7; T8), respectively, connected to the drain terminals (QA; QB) of said first and said second upper branch transistors (T1, T4; T2, T3), respectively;
   the gates of the first upper branch transistor (T1) of said first triple group and of the second upper branch transistor (T3) of said second triple group being connected together to constitute a first input terminal (122) of said first differential input (112, 122) of said analogue multiplier circuit;
   the gates of the second upper branch transistor (T2) of said first triple group and of the first upper branch transistor (T4) of said second triple group being connected together to constitute a second input terminal (112) of said first differential input (112,122) of said analogue multiplier circuit;
   the gate of said lower branch transistor (T5; T6) of said first and said second triple group, respectively, constituting a first (121) and a second (111) input terminal, respectively, of said second differential input (111,121) of said analogue multiplier circuit.

3. An input buffer circuit according to claim 2, wherein the channel geometry of the upper branch transistors in at least one of said first triple group and said second triple group are different from each other such that given equal gate source voltages of both upper branch transistors of the triple group, the channel impedances of the upper branch transistors of the triple group are different from each other.

4. An input buffer circuit according to claim 2, wherein a load impedance of said first load circuit is different from a load impedance of said second load circuit.

5. An input buffer circuit according to claim 4, wherein said first load circuit comprises a first load transistor (T7) and said second load circuit comprises a second load transistor (T8);
   the channel geometry of said first load transistor being different from the channel geometry of said second transistor.

6. An input buffer circuit according to claim 2, wherein a shunt impedance is connected to shunt a fraction of the current through one of said load circuits (T7, T8).

7. An input buffer circuit according to claim 1, further comprising a comparator circuit (OP) having its inputs connected to said output (QA, QB) of said analogue multiplier circuit (1);

an output of said comparator circuit (OP) being connected to provide said monitor output (MOUT).

8. An input buffer circuit according to claim 1, wherein said amplifier section (2) comprises an input stage (T9, T10) and a low impedance output stage (T11 to T14); and means (T16) for controlling the supply of operating current to said low impedance output stage in accordance with said control signal (MOUT) output by said monitor section (1).

9. An input buffer circuit according to claim 8, wherein said amplifier section (2) comprises means (T15) for setting the output of said amplifier section (2) to a predetermined output potential if said control signal (MOUT) indicates the absence of a data signal at the input (INN, INP) of said amplifier section (2).

* * * * *